United States Patent
Mok

(10) Patent No.: US 7,726,385 B2
(45) Date of Patent: Jun. 1, 2010

(54) HEAT DISSIPATION INTERFACE FOR SEMICONDUCTOR CHIP STRUCTURES

(75) Inventor: Lawrence Shungwei Mok, Brewster, NY (US)

(73) Assignee: International Business Machines Corporation, Armonk, NY (US)

(*) Notice: Subject to any disclaimer, the term of this patent is extended or adjusted under 35 U.S.C. 154(b) by 1027 days.

(21) Appl. No.: 10/784,624

(22) Filed: Feb. 23, 2004

(65) Prior Publication Data

US 2005/0183846 A1 Aug. 25, 2005

(51) Int. Cl.
F28F 7/00 (2006.01)
H05K 7/20 (2006.01)

(52) U.S. Cl. .................... 165/104.33; 165/80.3

(58) Field of Classification Search ............ 165/185, 165/80.3, 104.33, 104.34, 67–69; 361/700, 361/702–704, 726; 174/15.2, 16.3; 257/715, 257/718, 719, 722
See application file for complete search history.

(56) References Cited

U.S. PATENT DOCUMENTS

| | | | | |
|---|---|---|---|---|
| 5,548,482 A | * | 8/1996 | Hatauchi et al. | 361/720 |
| 5,771,966 A | * | 6/1998 | Jacoby | 165/185 |
| 5,909,358 A | * | 6/1999 | Bradt | 361/707 |
| 5,959,350 A | * | 9/1999 | Lee et al. | 257/712 |
| 6,008,989 A | * | 12/1999 | Lee et al. | 361/704 |
| 6,009,937 A | * | 1/2000 | Gonner et al. | 165/185 |
| 6,082,440 A | * | 7/2000 | Clemens et al. | 165/80.3 |
| 6,104,609 A | | 8/2000 | Chen | 361/695 |
| 6,176,304 B1 | * | 1/2001 | Lee | 165/185 |
| 6,188,578 B1 | * | 2/2001 | Lin et al. | 361/717 |
| 6,324,061 B1 | * | 11/2001 | Kinoshita et al. | 361/709 |
| 6,352,104 B1 | * | 3/2002 | Mok | 165/80.3 |
| 6,394,175 B1 | * | 5/2002 | Chen et al. | 165/80.3 |
| 6,742,573 B2 | * | 6/2004 | Sasaki et al. | 165/80.3 |
| 6,745,824 B2 | * | 6/2004 | Lee et al. | 165/104.14 |
| 6,776,224 B1 | * | 8/2004 | Chen | 165/80.3 |
| 2003/0019610 A1 | * | 1/2003 | Liu | 165/80.3 |

OTHER PUBLICATIONS

Mok, IBMTDR vol. 34, No. 4A, Sep. 1991—2 Pages Stacked, Thin Film HeatSink.

* cited by examiner

*Primary Examiner*—Tho v Duong
(74) *Attorney, Agent, or Firm*—Thomas A. Beck; Daniel P. Morris

(57) ABSTRACT

The present invention is directed to a modular heat dissipating device that consists of a plurality of sheet and beam members which are connected together by heat pipes. The sheet or support fin member is constructed by folding a piece of heat conducting material which is then mounted on a beam member. There are individual compliant interfaces built into the fin members such that a good thermal contact can be ensured with the heat generating semiconductor devices. The modular heat dissipating devices can be stacked up to gain higher cooling capacity or spread around to cover multiple chips on a printed-wiring board.

7 Claims, 6 Drawing Sheets

HEAT DISSIPATION INTERFACE FOR SEMICONDUCTOR CHIP STRUCTURES

FIELD OF THE INVENTION

The invention is directed to the dissipation of heat in semiconductor chip assemblies and in particular to heat dissipation involving conformable interfaces between the chips and the external ambient.

BACKGROUND AND RELATION TO THE PRIOR ART

The heat dissipating device which is usually known as the heat sink is commonly used to cool semiconductor chips. However, in usual constructions, such heatsinks have a hard base portion which produces a difficult to cover situation when there are multiple chips, multiple shapes and multiple mountings that in turn may be on a common carrier which may have a variation of spacing, heights and planarity.

There is, therefore, a need to have a heat dissipating interface device that is easy to manufacture while providing a compliant interface between the heat generating device and the transfer to the ambient dissipation device or heat sink. The having of a compliant interface takes on greater importance when the heat dissipation device is shared by several semiconductor devices on a common carrier such as a printed-wiring board.

The advantages of this invention are to provide a low thermal resistance between the heat generating devices and the common heat dissipating device or heat sink through the compliant interface and as the art progresses, it would be of advantage for any heat dissipating device to be modular with it's cooling capacity extendable by stacking and spreading.

There has been some progress in the art. In the IBM Technical Disclosure Bulletin publication, Vol. 34, No. 4A, September 1991, titled "Stacked, Thin Film Heat Sink", describes a method of making a heat sink using thin plates stacked together. In U.S. Pat. No. 6,104,609, titled "Structure Computer Central Processing Unit Heat dissipater", there is described a heat dissipater comprising of a fan, an upper cover, a heat sink assembly, and a lower cover, wherein the heat sink assembly is composed of numerous metal heat sink elements that are interlock-assembled together front to back in a flush arrangement.

SUMMARY OF THE INVENTION

Heat dissipation in multiple semiconductor chip devices on a common wiring bearing support such as a printed wiring board is achieved through the use of thermally efficient sheets of a material such as metal that are shaped, to permit high density contacting at the printed wiring board interface and to provide support for the use of lower density higher volume transfer, such as the use of heat pipes for continued heat transport in the desired heat transfer. The thermally efficient sheets which may be of metal and called support fins are constructed to be stacked to gain higher cooling capacity and to be spread around to cover multiple chips on a printed-wiring board.

BRIEF DESCRIPTION OF THE DRAWINGS

in FIG. 3a the use of folded metal and thermal grease;
in FIG. 3b the use of elastomeric resilience; and,
in FIG. 3c the use of low-melting point solders.

DESCRIPTION OF THE INVENTION

Figure 1:
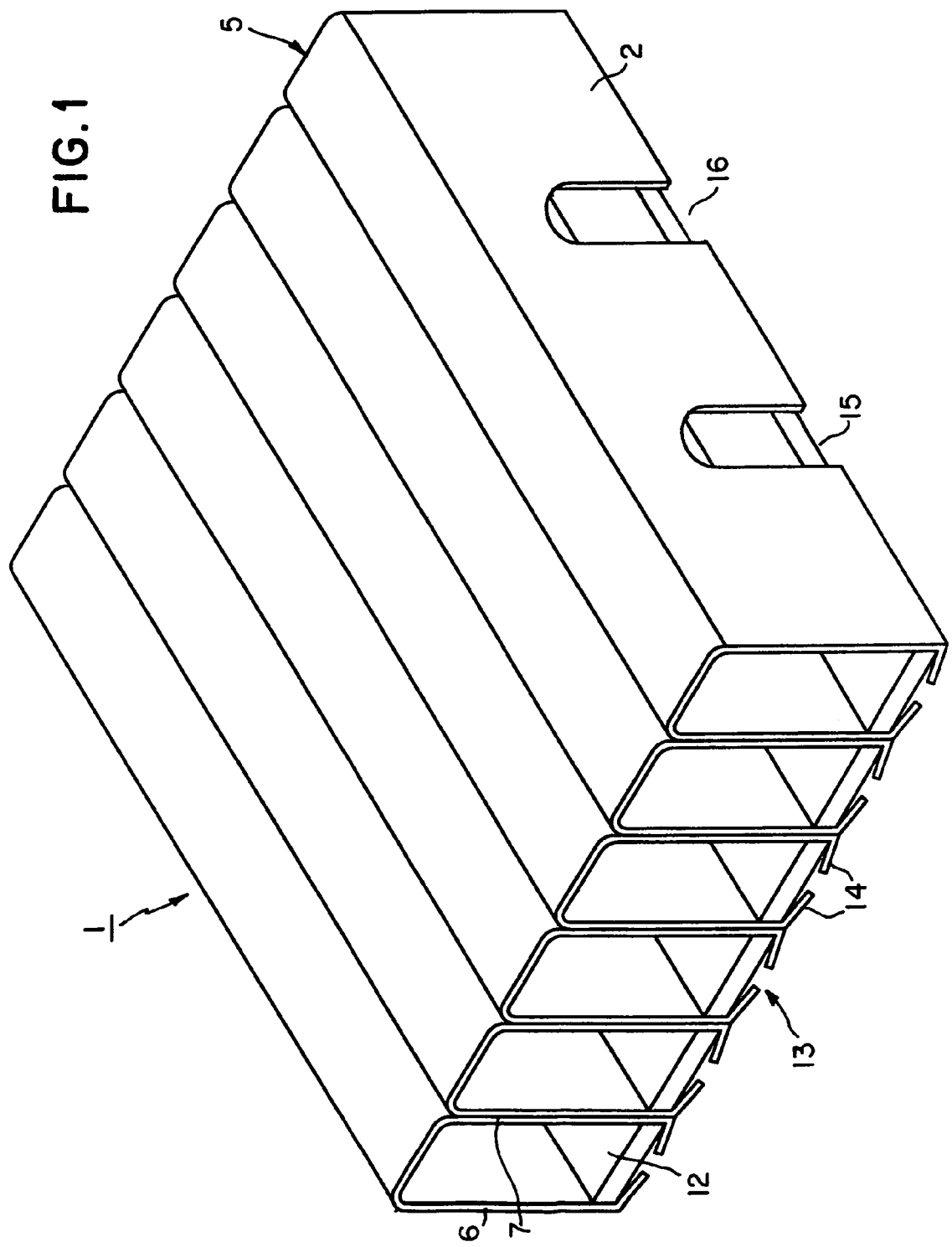
FIG. 1 is a perspective view of a modular portion of a heat dissipation interface structure of the principles of the invention.
Figure 2:
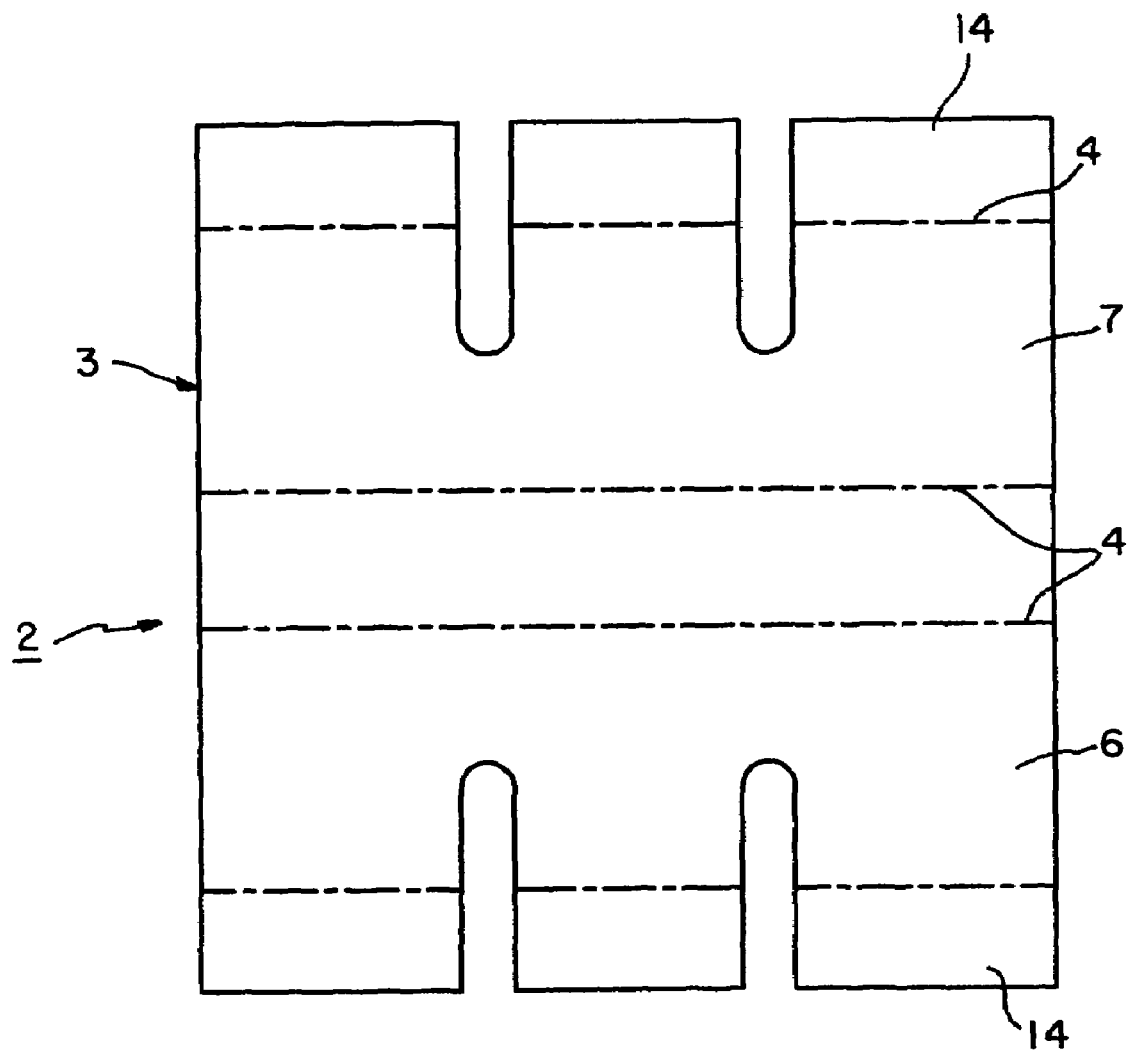
FIG. 2 illustrates a partially fabricated exemplary shape of a support fin before shaping.
Figure 3A:
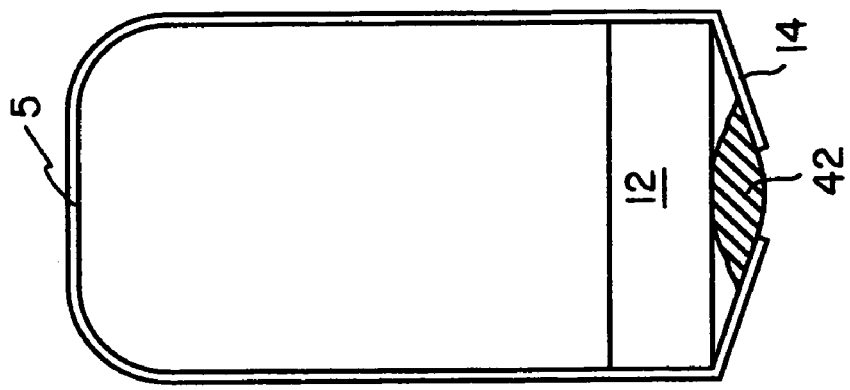
FIGS. 3a, 3b and 3c, each is a side view of the support fin member of the heat dissipation interface structure of the invention in which the support fin sheets of FIG. 2 are folded and are joined to a wiring pattern on the supporting substrate involving.
Figure 3B:
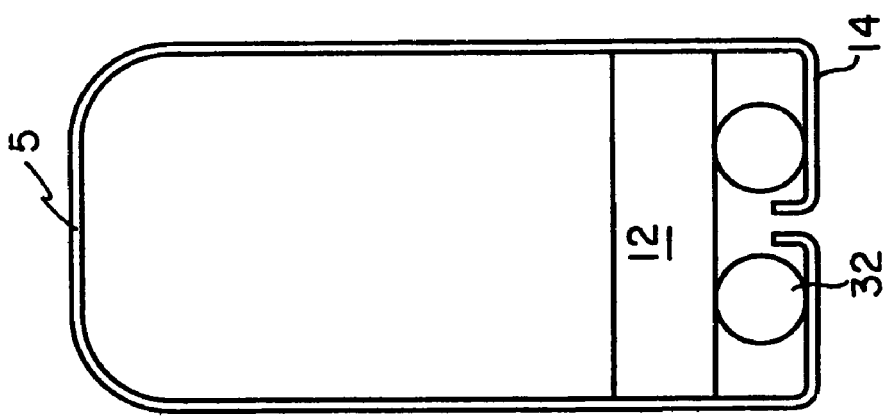
Figure 3C:
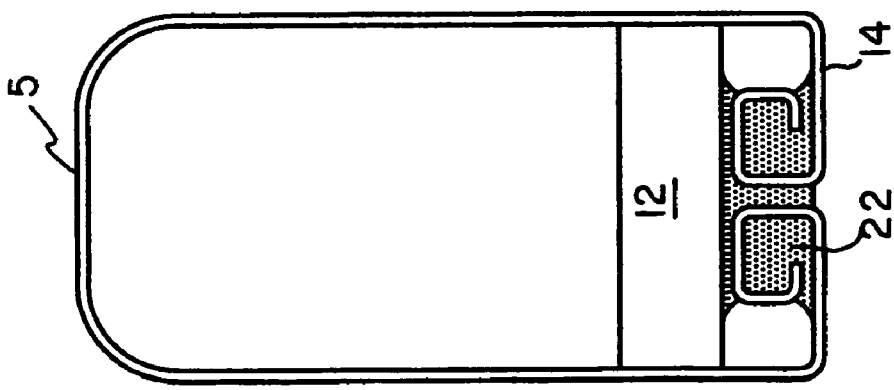

As illustrated in FIGS. 1, 2 and 3, in the invention a modular assembly of shaped support fin members is arranged parallel to and with contact to conductors of a wiring bearing area member such as a printed wiring board, a multilayer ceramic module or multiple chips on a supporting board and where the support fin members have a capability to support a heat pipe arrangement. Considering FIGS. 1, 2 and 3 together, FIG. 1 is a perspective view of a plurality of support fin members arranged as a modular portion of the heat dissipation interface structure with the principles of the invention; FIG. 2 illustrates a partially fabricated sheet before shaping into a support fin; and FIGS. 3a, 3b and 3c, are each a side view of different embodiments of the support fin component in which the support fin sheets of FIG. 2 are folded and are joined to the wiring pattern on the supporting substrate and attached in FIG. 3a using folded metal and thermal grease; in FIG. 3b using elastomeric resilience and in FIG. 3c using low-melting point solder.

Referring to FIG. 1, an assembly 1 of, for the convenience of explanation, six support fin members 2 are shown. The support fin members 2 are formed by folding a piece of a heat conducting material in sheet form of a material such as copper or aluminum metal, or graphite fiber composite, in the thickness range from 0.01 to 5 millimeters. An exemplary shape of the support fin member 2 before folding is shown as element 3 in FIG. 2. After the support fin member 2 is folded into a somewhat inverse U shape 5 in FIG. 1, along the fold lines 4 in FIG. 2, a beam-like member 12 in FIG. 1, will be inserted between the arms 6 and 7 of the U. The beam-like member 12 is thicker than the sheet material and is made of a heat conducting material such as copper or aluminum. The finger portions 14 at the edges the folded support fin member 2, shown in FIGS. 1, 2, 3a, 3b, and 3c are soldered, welded, brazed, or glued to the side walls of the beam-like member 12. The number of the finger portions 14 are not limited to three on each edge as shown in FIG. 2. The extension of the fin member 2 beyond the beam member 12 is then bent to form a contacting support structure as shown in FIGS. 3(a, b, & c). These structures become the compliant interface 13 for the modular heat dissipating interface device. The degree of compliance of this interface can further be enhanced by adding some thermally conductive materials such as thermally conductive greases 22 as shown in FIG. 3(c). The compliant interface can also be enhanced by inserting cylinders 32 made of metal or elastomeric resilient springing materials such as rubber or hollow metal tubes inside as shown in FIG. 3(b), and as shown in FIG. 3a by adding a low-melting-point solder 42 between the fingers 14 and the beam member 12.

Once the folded-fin members 2 are manufactured, a modular increment of them can be put together as an element 1 as shown in FIG. 1. They can be soldered, spotted welded, or glued together and mounted on other heavier heat transport apparatus such as being mounted or screwed on two horizontal bars not shown or assembled with a heat pipe structure. Such a heat pipe structure would involve heat pipes passing through openings 15 and 16 in FIG. 1 for transport of the heat accumulated in the beam members 12.

A number of variations such as using conduction blocks, stacking and heat transfer elements for heavier heat transport structures may be employed.

Figure 4:
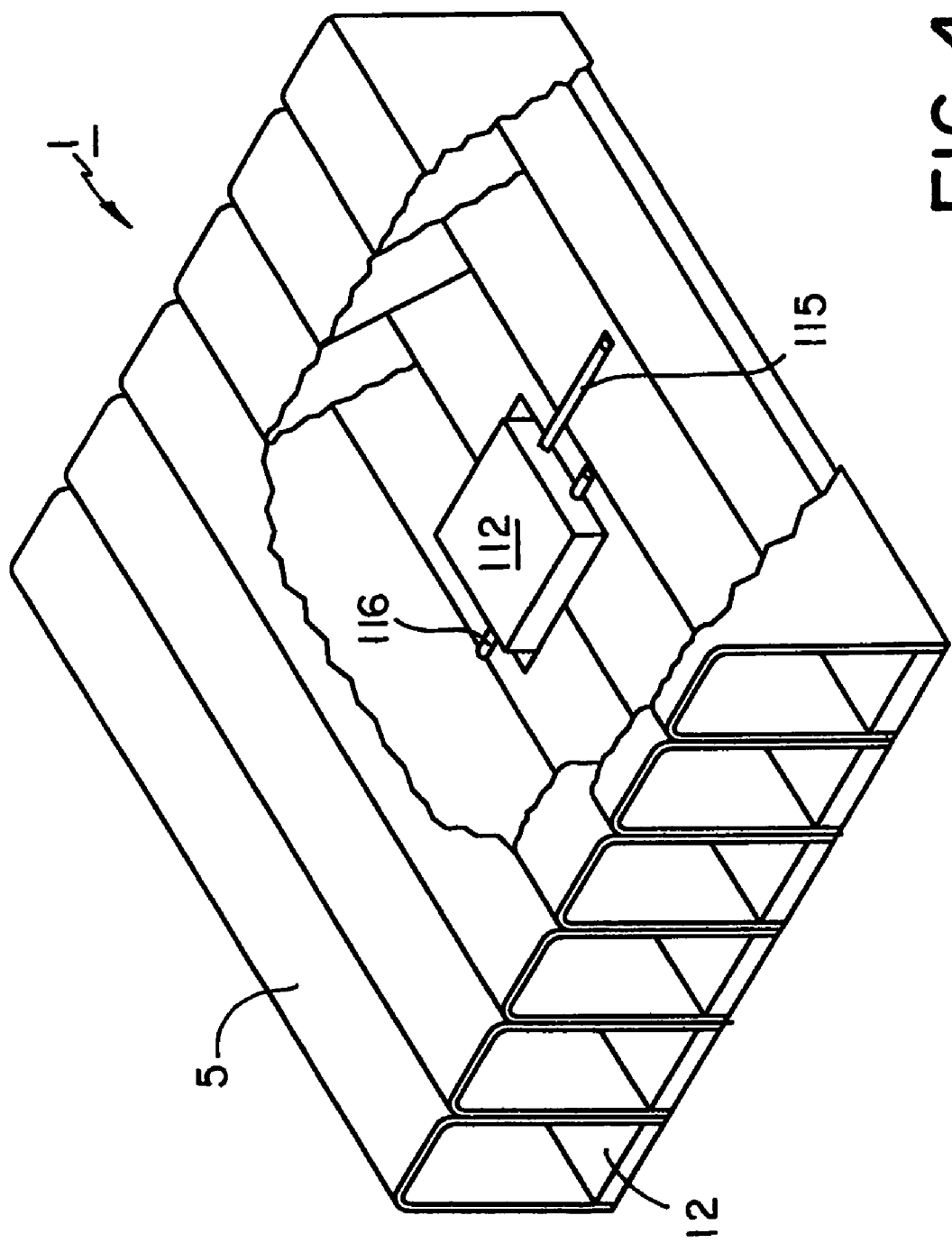
FIG. 4 is an illustration of the use of a heat conduction block and heat pipes in connection with the heat dissipation interface in the invention.

Referring to FIG. 4 there is shown an embodiment of the invention involving a separate heat conducting plate.

In the embodiment of FIG. 4, the structure at the edges of the support fins is eliminated. A separate heat conducting plate 112 which is made of heat conducting materials such as copper or aluminum is used to provide a compliant interface between a heat generating device which is not shown in the figure and the modular heat dissipating device. As shown in FIG. 4, that is cut away so that the heat conducting plate 112 can be seen. The plate 112 is not mechanically connected to the beam members 12 and is free to move up and down slightly in the cavity formed by the plurality of the beam members 12. Heat collected in the heat conducting plate 112 is passed to the modular heat dissipating device 1 made up a number of joined folded fin members 5 through a plurality of heat pipes 115 and 116. One end of the heat pipe 115 is embedded into the heat conducting plate 112 and the end of heat pipe 116 is mounted or embedded in a plurality of the beam members 12. A spring, which is not shown in the figure, is placed between the top surface of the heat conducting plate 112 and the cut away under the top surface of the folded fin members 5. When the modular heat dissipating device is brought in contact with a heat generating device which is not shown in the figure, the heat conducting plate 112 will be forced to make a good thermal contact to the surface of the heat generating device.

The thermal transport using the heat dissipation principles of the invention are readily employed in stacking structures.

Figure 5:
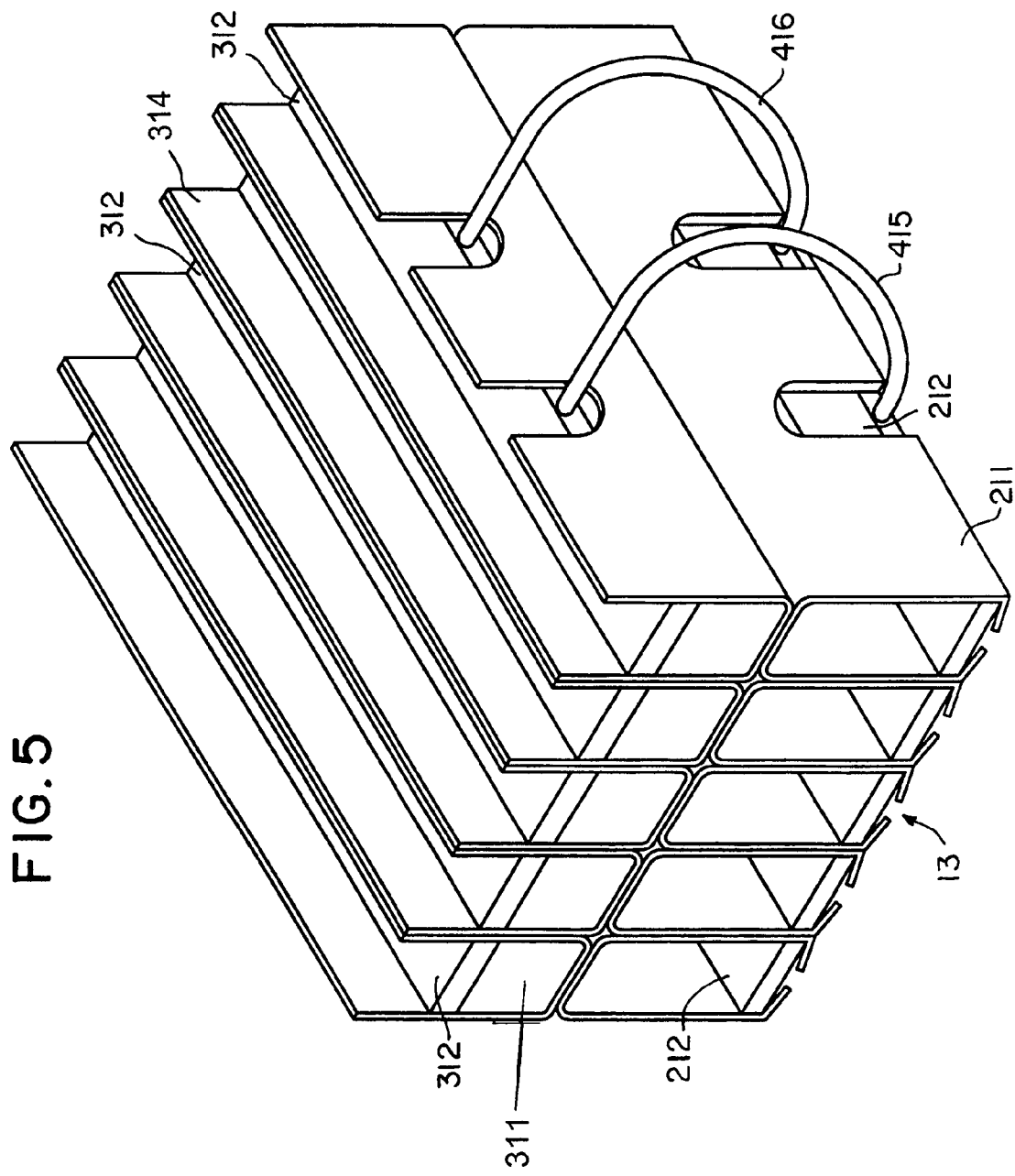
FIG. 5 is an illustration of the stacking of modular support fin heat pipe heat dissipating interface of the invention.

Referring to FIG. 5 there is shown two similar modular heat dissipating devices stacked together. When these stacked heat dissipating devices are placed on top of heat generating semiconductor chips, heat is first conducted through the compliant interface 13 to the fin members 211 and the beam members 212, then to the heat pipes 415 and 416, and then to the beam members 312 and fin members 311.

Cooling media such as air will travel among the fin members 211 and 311 to carry heat away from the heat dissipating device. The fin members in the lower and upper portion of the device are about the same except that the lower portion have the compliant interface 13 and the upper portion does not. The finger portions 314 at the upper fin members 311 are constructed to enhance as much thermal transfer as possible to the traveling cooling media.

Figure 6:
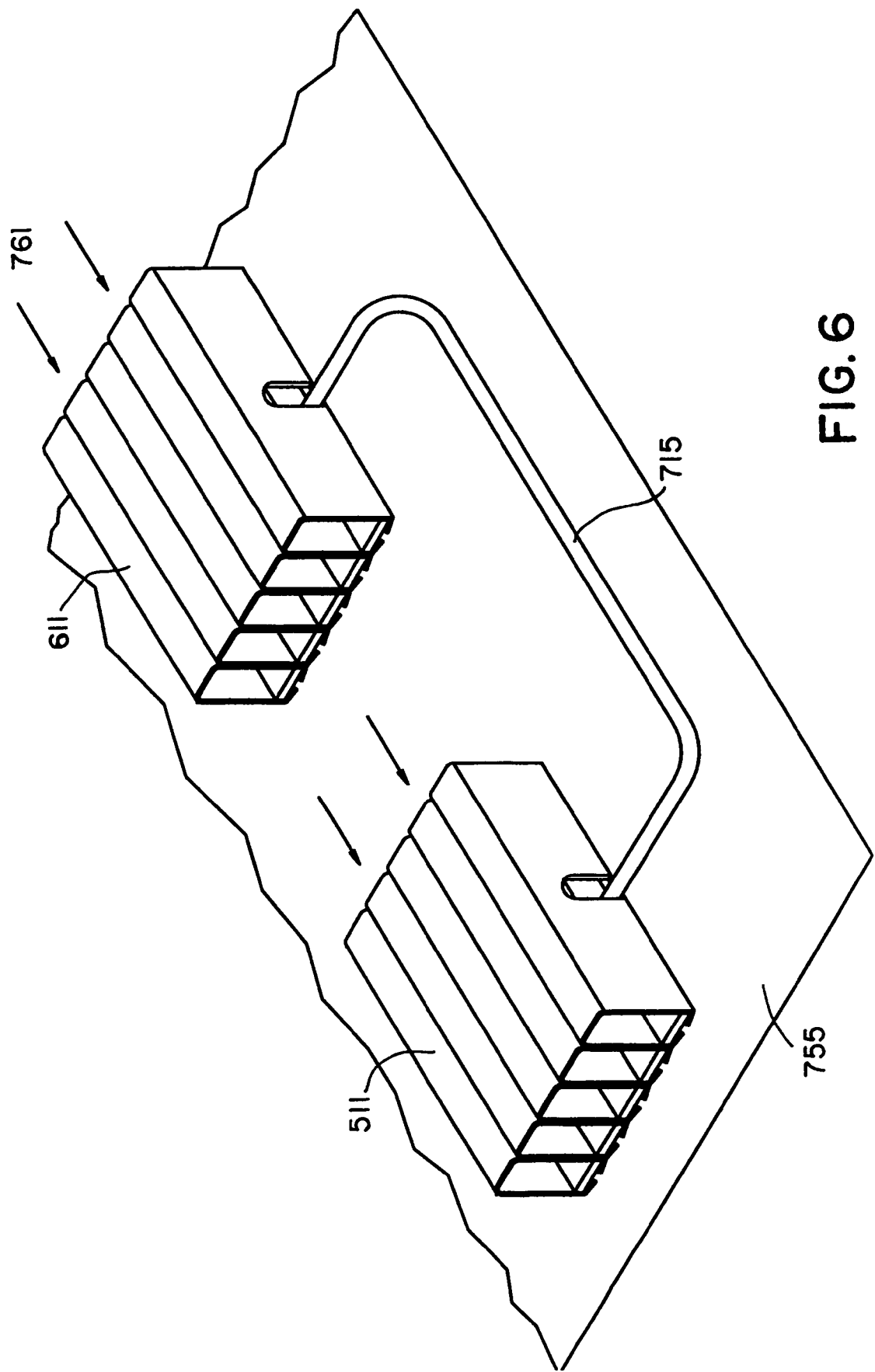
FIG. 6 is an exemplary illustration of the modular fin supporting heat pipe heat dissipating interface device of the invention illustrating the considerations of multiple chips in one planar area.

The heat transfer principles of the invention readily accommodate the concept of multiple cooling assemblies on the same substrate. Referring to FIG. 6 there is shown multiple modular heat dissipating devices in the same substrate. In the figure, there are two modular heat dissipating devices 1 which have similar fin members 511 and 611, placed on and covering in this figure, two separate heat generating semiconductor chips which are mounted on a printed-wiring board 755. A heat pipe 715 is connected between the two modular heat dissipating devices such that heat can be transferred between them. The cooling media 761 is flowing along the fin members 511 and 611 serially. Since the cooling media 761 meets the fin members 611 first, the temperature of this device is generally lower than that of the device with fin members 511 downstream. The heat pipe 715 will carry the heat from the device with fin members 511 back to the device with fin members 611 to even out the temperature difference automatically.

What has been described is a heat transfer principle where heat generated in semiconductor chips is transferred into an assembly of fin supporting members made up of a material such as metal that are arranged, to permit high density contacting at the chip interface and to provide support for the use of higher volume transfer, such as the use of heat pipes for continued heat transport in the desired heat transfer.

What is claimed is:

1. A heat sink comprising a heat sink modular assembly for improving the transfer of heat from at least one heat source mounted on a common wiring bearing planar support to said heat sink modular assembly radiating into the ambient, wherein said a heat source is a semiconductor chip device on said common wiring bearing planar support, said semiconductor chip device is mounted on said common wiring bearing planar support, forming a combination, said combination comprising an area, said heat sink modular assembly having a plurality of support fin members contiguously aligned side by side, said support fin members being formed from heat conducting material sheets selected from the group consisting of copper, aluminum or graphite fiber composite, said support fin members being in horizontal and vertical alignment with one another and extending along a longitudinal axis, said support fin members being in alignment with said planar support and covering said combination comprising said area;

each said support fin member having been formed from a single said heat conducting material sheet and folded into a substantially inverse U shape, each said support fin member having a top surface that extends continuously along said longitudinal axis of said support fin member, and having a first side arm and a second side arm diametrically opposite each other, each said support fin member first side arm and second side arm having an inside surface, an outside surface and an edge, each said edge having a finger portion, each said finger portion comprising a planar surface;

a plurality of parallel beam members made from heat conducting material, each said beam member having top, bottom and a first side wall and a second side wall, said first and second side walls of each beam member being positioned between and in contact with said inside surface of said first and second side arms respectively of each said support fin member;

said finger portion of said edge extending below said bottom wall of said beam member and at said bottom wall of said beam member being folded inwardly beneath said beam toward a center line of each said beam member into said inwardly folded position to form a contacting support structure for said heat sink, said finger portions folded inwardly beneath said beam forming a compliant interface in contact with said heat source to dissipate heat emanating from said heat source to said heat sink.

2. The heat sink modular assembly defined in claim 1 wherein said first and second side aims sides are in a thickness range from 0.01 to 5 millimeters.

3. The heat sink modular assembly defined in claim 2 wherein said first and second side arms are fixed to said first and second sides respectively of said beam member by a technique selected from the group consisting of soldering, brazing, welding or gluing.

4. The heat sink modular assembly device defined in claim 1 wherein said compliance is enhanced through at least one technique selected from the group consisting of: introducing thermally conductive grease between said finger portion of said folded edge which extends below said bottom wall of said beam member; introducing increasing resilience members between said folded edges and said bottom of said beam member; and, the use of low melting point solder at said folded edges at said bottom of said beam member.

5. The heat sink modular assembly as defined in claim 1 wherein said finger portions of said heat sink modular assembly are positioned atop and in contact with said semiconductor chip device which comprises a multilayer ceramic module which is contacted to a supporting wiring board.

6. The heat sink modular assembly as defined in claim 1 wherein said finger portions of said heat sink modular assembly are mounted atop and in contact with said semiconductor chip device which is contacted to a supporting wiring board.

7. The heat sink modular assembly as defined in claim 1 wherein said finger portions of said heat sink modular assembly is placed atop and in contact with said semiconductor chip contacted to a supporting wiring board.

\* \* \* \* \*